(12) United States Patent
Knoedgen

(10) Patent No.: US 8,692,606 B2
(45) Date of Patent: Apr. 8, 2014

(54) EXTERNAL POWER TRANSISTOR CONTROL

(75) Inventor: Horst Knoedgen, Munich (DE)

(73) Assignee: Dialog Semiconductor GmbH, Kirchheim/Teck-Nabern (DE)

( * ) Notice: Subject to any disclaimer, the term of this patent is extended or adjusted under 35 U.S.C. 154(b) by 8 days.

(21) Appl. No.: 13/478,733

(22) Filed: May 23, 2012

(65) Prior Publication Data

US 2013/0200928 A1    Aug. 8, 2013

(30) Foreign Application Priority Data

Feb. 8, 2012    (EP) .................................... 12154526

(51) Int. Cl.
*H03K 17/16*    (2006.01)

(52) U.S. Cl.
USPC ........... 327/389; 327/108; 327/384; 327/551; 327/592; 326/26

(58) Field of Classification Search
None
See application file for complete search history.

(56) References Cited

U.S. PATENT DOCUMENTS

| 6,271,709 | B1 | 8/2001 | Kimura et al. | |
| 6,906,574 | B2 * | 6/2005 | Ohi et al. | 327/392 |
| 7,737,761 | B2 * | 6/2010 | Ishikawa et al. | 327/380 |
| 2005/0017768 | A1 | 1/2005 | de Frutos et al. | |

FOREIGN PATENT DOCUMENTS

| EP | 1 122 885 | 8/2001 |
| WO | WO 2009/039684 | 4/2009 |

OTHER PUBLICATIONS

European Search Report 12154526.3 Mail date Aug. 2, 2012, Dialog Semiconductor GmbH.

* cited by examiner

*Primary Examiner* — Lincoln Donovan
*Assistant Examiner* — Terry L Englund
(74) *Attorney, Agent, or Firm* — Saile Ackerman LLC; Stephen B. Ackerman

(57) ABSTRACT

A method and system avoid ringing at an external power transistor subsequent to switching OFF the external power transistor. A driver circuit generates a drive signal for switching the external power transistor between OFF-state and ON-state. The driver circuit comprises a drive signal generation unit configured to generate a high drive signal triggering the external power transistor to switch to ON-state, wherein an output resistance of the driver circuit is adjustable, an oscillation detection unit to detect a degree of oscillation on the drive signal, and a resistance control unit to adjust the output resistance of the driver circuit based on the degree of oscillation on the drive signal.

20 Claims, 7 Drawing Sheets

EXTERNAL POWER TRANSISTOR CONTROL

TECHNICAL FIELD

The present document relates to the control of an external power transistor. In particular, the present document relates to a method and system for avoiding ringing at the external power transistor subsequent to switching of the external power transistor.

BACKGROUND

Transistors may be used as switches e.g. within switched-mode power supplies (e.g. buck converters, boost converters or buck-boost converters). In the context of such applications, the transistors are switched between the on-state and the off-state of the transistor in a periodic manner in accordance to a commutation cycle rate. The commutation cycle rate is typically in the range of 100 kHz (for high voltage power electronic applications) and in the range of several MHz (for low voltage applications), and the ratio of the length of the on-state and the length of the off-state (referred to as the duty cycle) may be used to control the conversion ratio (between the input voltage and the output voltage) of the switched-mode power supply.

The transition from the on-state to the off-state and vice versa may be controlled using a driver signal (i.e. a signal to the gate of the transistor) generated by a driver circuit. The driver circuit may be separate from the power transistor, i.e. the transistor may be external to the driver circuit. In other words, the driver circuit may be implemented in a dedicated integrated circuit, separate from the power transistor.

If an external transistor is switched on fast (i.e. switched on with a steep step function of the driver signal), the current through the external transistor may start to oscillate due to parasitic inductors and capacitors of the external transistor (and the neighbouring circuitry of the external transistor, e.g. the circuitry of the switched mode power supply). In other words, subject to the receipt of a transient drive signal (e.g. a pulsed drive signal) from the driver circuit putting the external power transistor to the on-state, the parasitic capacitances and inductances in the external power transistor and the circuitry in the neighborhood of the external power transistor may cause ringing artifacts on the source current of the external transistor. For measuring the ringing of the source current, an external resistor, as well as an additional measurement pin within the driver circuit may be used. This allows for an explicit measurement of the presence of ringing artifacts, however, the measurement circuitry also requires an additional external resistor, as well as an additional pin within the driver circuit. Hence, the explicit measurement of ringing of the source current at the external power transistor is relatively complex.

The present document addresses the above mentioned shortcomings of driver circuits causing ringing artifacts at an external power transistor. In particular, the present document describes a method and system for detecting and compensating ringing artefacts at the external power transistor directly within the driver circuit, thereby removing the need for additional external components (such as an external resistor) and the need for an additional measurement pin at the driver circuit.

SUMMARY

A principal object of the present disclosure is to achieve a method and system for detecting and compensating ringing artifacts at an external power transistor directly within a driver circuit driving the power transistor.

A further object of the disclosure is to achieve the method and system described above without requiring additional external components (such as an external resistor) and an additional measurement pin at the driver circuit.

A further object of the disclosure is to achieve an adjustable output resistance of the driver circuit.

A further object of the disclosure is to achieve an oscillation detection unit configured to detect a degree of oscillation of the drive signal.

According to an aspect a driver circuit configured to generate a drive signal for switching a driven switch between an off-state and an on-state (e.g. from the off-state to the on-state) is described. Typically, the driven switch is separate from the driver circuit, i.e. typically the driver circuit is implemented as an integrated circuit which does not comprise the driven switch. In other words, the driven switch may be external to the driver circuit. By way of example, the driven switch may be a transistor, e.g. a power transistor. In particular, the driven switch may be a MOS transistor such as an NMOS (N-channel metal oxide semiconductor) transistor or a PMOS (P-channel MOS) transistor. The driven switch may be the high side or low side switch of a switched mode power supply (e.g. a step-up converter such as a boost converter or a step-down converter such as a buck converter). In other words, the driven switch may be any kind of switched power transistor (used e.g. in a buck converter, a boost converter, a fly back converter etc.) The drive signal may be a voltage applied to a gate of the driven switch.

The driver circuit may be configured to generate the drive signal for switching the driven switch between the off-state and the on-state without (or with a limited amount of) ringing, i.e. without (or with a limited amount of) oscillations on a drain source current through the driven switch. The driver circuit may comprise a drive signal generation unit configured to generate a high drive signal triggering the driven switch to switch to the on-state. The output resistance of the driver circuit may be adjustable. Furthermore, the driver circuit may comprise an oscillation detection unit configured to detect a degree of oscillation on (or of) the drive signal. In addition, the driver circuit may comprise a resistance control unit configured to adjust the output resistance of the driver circuit based on the degree of oscillation on the drive signal.

The driver circuit (or the drive signal generation unit) may comprise a high side gate control switch configured to couple the gate of the driven switch to a supply voltage via an overall high side resistance, thereby generating a high drive signal triggering the driven switch to switch to the on-state. When generating the high side signal, the output resistance of the driver circuit may correspond to the overall high side resistance. Furthermore, the driver circuit may comprise a low side gate control switch configured to couple the gate of the driven switch to ground via an overall low side resistance, thereby generating a low drive signal triggering the driven switch to switch to the off-state. When generating the low side signal, the output resistance of the driver circuit may correspond to the overall low side resistance. The high drive signal and the low drive signal may be generated in a periodic manner, thereby switching the (external) driven switch from the on-state to the off-state (and vice versa) in a periodic manner. The complete period (comprising an on-state and an off-state of the driven switch) may be referred to as a commutation cycle which is repeated at a commutation cycle rate. The high side/low side control switches may be transistors (e.g. MOS transistors such as NMOS or PMOS transistors).

In the present document, the term "coupled" refers to elements being in electrical communication with each other, whether directly connected e.g., via wires, or in some other manner.

In a preferred embodiment, the (external) driven switch is operated in a pulsed mode. In other words, the high side gate control switch (as well as the low side gate control switch) may be operated in a pulsed mode. A pulsed high drive signal may be generated by coupling the gate of the driven switch to the supply voltage for a pre-determined time interval (pulse duration), wherein the pre-determined time interval is shorter than the duration of the on-state of the external driven switch. Subsequent to the pulsed high drive signal, the gate of the driven switch may float. In a similar manner, a pulsed low drive signal may be generated by coupling the gate of the driven switch to ground for a pre-determined time interval (pulse duration), wherein the pre-determined time interval is shorter than the duration of the off-state of the external driven switch. Subsequent to the pulsed low drive signal, the gate of the driven switch may float.

As indicated above, the output resistance (or output impedance) of the driver circuit may be adjustable. In a similar manner, the overall high side resistance and/or the overall low side resistance may be adjustable. For this purpose, the high side resistance may comprise an on-resistance of the high side gate control switch. The on-resistance of the high side gate control switch may be adjustable via a gate voltage applied to the high side gate control switch. Alternatively or in addition, the high side resistance may comprise an adjustable resistance unit in series with the high side gate control switch. The adjustable resistance unit may comprise one or more parallel auxiliary switches. The auxiliary switches may be transistors, e.g. MOS transistors such as NMOS or PMOS transistors. The resistance of the adjustable resistance unit may be adjusted by closing more or less of the parallel auxiliary switches. Alternatively or in addition, the high side resistance may comprise an (adjustable) serial resistance in series with the high side gate control switch. The low side resistance may comprise similar components.

As indicated above, the driver circuit may comprise an oscillation detection unit configured to detect a degree of oscillation of the drive signal. The degree of oscillation may be associated with a maximum amplitude of the oscillation of the drive signal. In particular, the degree of oscillation may be associated with an oscillation of the drive signal subsequent to a high drive signal pulse or a low drive signal pulse (generated by the high side control switch or the low side control switch, respectively). In other words, the driver circuit may be operated in a pulsed mode, and the oscillation detection unit may be configured to detect the degree of oscillation of the drive signal subsequent to the end of a high drive signal pulse or subsequent to the end of a low drive signal pulse (i.e. within the time interval between the end of the high drive signal pulse and the beginning of a subsequent low drive signal pulse, or in the time interval between the end of the low drive signal pulse and the beginning of a subsequent high drive signal pulse).

The oscillation detection unit may comprise a first oscillation detection path configured to detect a first output voltage based on the drive signal, wherein the first output voltage is indicative of the degree of oscillation on the drive signal. The first oscillation detection path may comprise a current source and a first switch (which may be coupled in series to each other). The first switch may be configured to conduct current provided by the current source. Furthermore, the first oscillation detection path may comprise a first output port between the current source and the first switch, wherein the first output voltage is provided at the first output port.

The first switch may have an adjustable on-resistance. For this purpose, the first switch may be operated in its linear region. This may be achieved by using an offset unit configured to switch the first switch to the on-state prior to the generation of the high drive signal (or prior to the generation of the low drive signal). As a consequence, the gate voltage at the first switch may be offset in such a manner that the high drive signal (or the low drive signal) lead to gate voltages at the first switch within the linear region of the first switch.

The first switch may be coupled to the drive signal, such that oscillations on the drive signal result in corresponding oscillations of the on-resistance of the first switch. Such oscillations of the on-resistance of the first switch will typically result in corresponding oscillations of a voltage drop (drain-source voltage) at the first switch. Furthermore, the first oscillation detection path may comprise a capacitor arranged in parallel to the current source and configured to low-pass filter oscillations of the voltage drop at the first switch.

The oscillation detection unit may comprise a second oscillation detection path configured to detect a second output voltage based on the drive signal. The second oscillation detection path may be designed in a similar manner to the first oscillation detection path. Hence, the second output voltage may be indicative of the degree of oscillation on the drive signal. However, the second output voltage may have a polarity opposite to the first output voltage. This may e.g. be achieved by using an NMOS transistor as the first switch (within the first oscillation detection path) and a PMOS transistor as a second switch (within the second oscillation detection path) or vice versa.

As indicated above, the driver circuit may comprise a resistance control unit configured to adjust the output resistance of the driver circuit (e.g. the overall high side resistance and/or the overall low side resistance) based on the degree of oscillation detected on the drive signal. In particular, the resistance control unit may be configured to adjust the high side/low side resistance such that the degree of oscillation is at or below a pre-determined threshold, while at the same time minimizing the overall high side/low side resistance (in order to minimize the losses incurred by the driver circuit). In particular, the resistance control unit may be configured to increase the overall high side resistance to lower the degree of oscillation, if the degree of oscillation is above the pre-determined threshold. Furthermore, the resistance control unit may be configured to decrease the overall high side resistance, if the degree of oscillation is below the pre-determined threshold.

According to another aspect, a method for maintaining a degree of oscillation of the drain source current of a (external) driven switch below a pre-determined threshold, when switching the (external) driven switch between an off-state and an on-state is described. The method may comprise generating a high side drive signal (i.e. the high drive signal) at a gate of the driven switch, by coupling the gate of the driven switch to a supply voltage via an overall high side resistance. The method proceeds in measuring a degree of oscillation at the gate of the driven switch, subject to the high side drive signal. The overall high side resistance may be adjusted based on the measured degree of oscillation at the gate of the driven switch. In particular, the overall high side resistance may be adjusted in order to select a minimum high side resistance for maintaining the measured degree of oscillation at the gate of the driven switch at or below a pre-determined degree of oscillation.

As indicated above, the high side drive signal may be a pulsed signal having a pre-determined pulse duration. The degree of oscillation at the gate of the driven switch may be measured subsequent to the pre-determined pulse duration (i.e. subsequent to the end of the pulsed signal). The above mentioned method is equally applicable to adjusting the low side resistance for generating a low side drive signal (i.e. the low drive signal).

According to another aspect, a power converter (e.g. a switch-mode power supply) comprising the driven switch and the driver circuit (as outlined in the present document) is described.

In accordance to objectives of the disclosure method for maintaining a degree of oscillation of the drain source current of a driven switch below a pre-determined threshold, when switching the driven switch between an off-state and an on-state, has been achieved. The method disclosed comprises steps of: providing a driver circuit, the switch driven by the driver circuit, and a resistance control unit, generating by the driver circuit a high side drive signal at a gate of the driven switch, by coupling the gate of the driven switch to a supply voltage via an overall high side resistance, measuring a degree of oscillation at the gate of the driven switch, subject to the high side drive signal, and adjusting the overall high side resistance based on the measured degree of oscillation at the gate of the driven switch.

It should be noted that the methods and systems including its preferred embodiments as outlined in the present document may be used stand-alone or in combination with the other methods and systems disclosed in this document. Furthermore, all aspects of the methods and systems outlined in the present document may be arbitrarily combined. In particular, the features of the claims may be combined with one another in an arbitrary manner.

BRIEF DESCRIPTION OF THE DRAWINGS

The disclosure is explained below in an exemplary manner with reference to the accompanying drawings, wherein.

DETAILED DESCRIPTION

Figure 1:
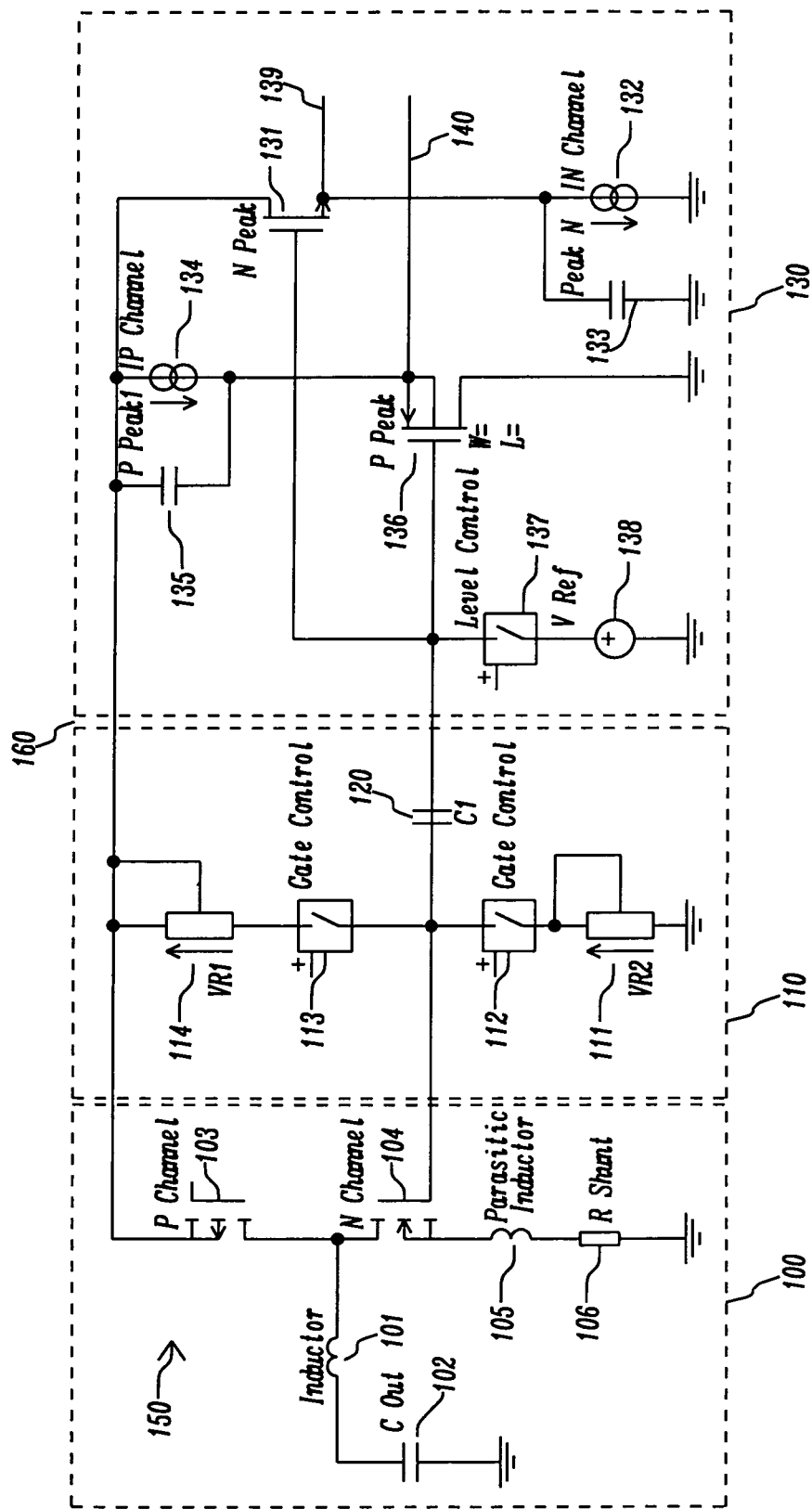
FIG. 1 illustrates a circuit diagram of an example driver circuit for an external transistor (i.e. a driven switch)

FIG. 1 illustrates a circuit diagram 150 of a switched-mode power supply 100, in particular a buck converter 100, and an example driver circuit 160 for driving the low side switch 104 of the buck converter 100. Typically the driver circuit 160 is implemented as an integrated circuit, separate from components of the buck converter 100. Hence, the low side switch 104 is typically external to the driver circuit 160. In the following, the driver circuit 160 is described as a driver circuit for driving the low side switch 104 of a buck converter 100. It should be noted, however, that the aspects of the driver circuit 160, which are described in the present document, are applicable to driver circuits for any kind of switches such as MOS transistors or bipolar transistors. For this reason, the low side switch 104 will be referred to in the following in short as driven switch 104.

The buck converter 100 comprises a high side switch 103 (e.g. a transistor, such as a MOS transistor (e.g. a PMOS transistor) or a bipolar transistor), the low side switch 104 (e.g. a transistor, such as a MOS transistor (e.g. an MMOS transistor) or a bipolar transistor), as well as an inductor 101 and a capacitor 102, wherein the capacitor 102 is positioned in parallel to the output voltage provided by the buck converter 100 (and in parallel to a load connected to the buck converter 100). Furthermore, FIG. 1 illustrates a parasitic inductor 105 of the buck converter 100. This parasitic inductor 105 may cause oscillations of the source current (in conjunction with the parasitic capacitors comprised within the low side switch 104), subject to a transient at the gate of the low side switch 104. In addition, FIG. 1 illustrates a shunt resistor 106 which may be used to explicitly measure the source current (and oscillations comprised within the source current). The voltage drop at the shunt resistor 106 may be captured by the driver circuit 160 using a pin which is coupled to the shunt resistor 106, thereby providing the driver circuit 160 with an explicit indication of the source current at the low side switch 104.

The driver circuit 160 of the driven switch 104 comprises a driver signal generation unit 110 and an oscillation detection unit 130. The driver signal generation unit 110 is configured to generate a drive signal for switching the low side switch 104 from the on-state to the off-state and vice versa. The drive signal is typically a drive voltage (i.e. a gate voltage of the driven switch 104), and the driver signal generation unit 110 is typically configured to generate a high drive signal (i.e. a high drive voltage) for switching the driven switch 104 to the on-state, and to generate a low drive signal (i.e. a low drive voltage) for switching the driven switch 104 to the off-state. It should be noted that the polarity of the drive signal (e.g. the gate voltage) depends on the implementation of the driven switch 104. If the driven switch 104 is an NMOS transistor, then the drive signal corresponds to a gain-to-source voltage. On the other hand, if the driven switch 104 is a PMOS transistor, then the drive signal corresponds to a source-to-gain voltage.

The driver signal generation unit 110 may comprise a low side gate control switch 112 and a high side gate control switch 113 for generating the drive signal. Alternative implementations may make use of current sources. The two switches 112, 113 may be implemented e.g. as MOS transistors such as PMOS and/or NMOS transistors. The two switches 112, 113 are used to generate a low drive signal (having a low voltage value) for switching off the driven switch 104, and a high drive signal (having a high voltage value) for switching on the driven switch 104, respectively. The low drive signal and the high drive signal are typically generated in a periodic manner in accordance to the commutation cycle rate of the switched-mode power supply 100. Typical values for the commutation cycle rate are in the range of 50 kHz (e.g. 100 kHz) to several MHz. Typically, the higher the input and/or output voltage of the switched-mode power supply 100, the lower the commutation cycle rate. The commutation cycle rate should be greater than 20 kHz, in order to be out of the audible range (i.e. in order to avoid acoustic noise). The upper limit of the commutation cycle rate is mainly limited by the technology of the driver switch 104 and/or by the losses incurred during switching of the driven switch 104.

It should be noted that the driven switch 104 may be operated in a pulsed mode, meaning that the low drive signal and the high drive signal may be pulse signals which cause the driven switch 104 to switch to the off-state and the on-state, respectively. Subsequent to the respective pulse, the gate of the driven switch 104 floats. The pulse mode may be implemented by briefly switching on the high side gate control switch 113, thereby generating a pulsed high drive signal, and/or by briefly switching on the low side gate control switch 112, thereby generating a pulsed low drive signal. Hence, the gate of the external driven switch 104 may be driven by short pulses. Subsequent to the pulse, the gate of the external driven switch 104 floats until the receipt of the next (opposite) pulse.

When applying a high drive signal to the gate of the driven switch 104 (e.g. an NMOS transistor), the gate of the driven switch 104 is charged, thereby creating the conduction channel within the driven switch 104. The gate of the driven switch 104 may be modeled by a gate-source capacitor (typically in the range of up to a few nF), which is charged upon application of a high drive signal and which is discharged upon application of the low drive signal. This gate-source capacitor (as well as other parasitic capacitors of the driven switch 104) creates a resonant circuit (LC circuit) with the parasitic inductor 105, wherein the resonant frequency of the resonant circuit depends on the value of the parasitic capacitors and inductor. This resonant frequency may be excited by the high frequencies components comprised within a transient high drive signal (or a transient low drive signal), thereby creating oscillations (ringing) of the source-drain current of the driven switch 104. In particular, the resonant frequency may be excited by high frequency components comprised within a transient charging or discharging current of the gain-source capacitor following a transient high drive signal or a transient low drive signal. It may therefore be beneficial to remove the high frequency components from the transient charging/discharging current, in order to avoid the excitation of the resonant frequency of the resonant circuit, thereby avoiding ringing.

As indicated above, the application of a high side signal triggers the charging of the gate-source capacitor of the driven switch 104, thereby putting the driven switch 104 into the on-state. It is proposed in the present document to control the charging speed of the gate-source capacitor, in order to remove the high frequency components from the charging current (and in a similar manner from the discharging current). The charging speed may be controlled by use of an adjustable resistance which creates an RC filter (resistor-capacitor filter) in conjunction with the gate-source capacitor of the driven switch 104, thereby removing the undesirable high frequency components from the charging/discharging current. The adjustable resistance may be adjusted in order to adjust the cut-off frequency of the resulting RC filter. By adjusting the cut-off frequency in accordance to the resonant frequency of the parasitic LC circuit of the driven switch 104, oscillations of the source-drain current at the driven switch 104 can be avoided. Hence, by appropriately adjusting the adjustable resistance, ringing artifacts at the driven switch 104 (subject to switching from off-state to on-state or vice versa) can be avoided.

The adjustable resistance may be implemented by making use of low side and high side gate control switches 112, 113 having an adjustable on-resistance $R_{on}$. The on-resistance $R_{on}$ of the low side and high side gate control switches 112, 113 (e.g. transistors) is typically dependent on a width and/or length of the respective transistor. The adjustable resistance 111, 114 may be adjusted by adjusting the on-resistance $R_{on}$ of the low side and high side gate control switches 112, 113 (typically by adjusting the gate voltage of the respective transistor). VR1 signifies a voltage drop along adjustable resistance 114 and respectively VR2 signifies a voltage drop along adjustable resistance 111. Alternatively or in addition, an adjustable series resistance 111, 114 may be used within the driver circuit 160. Overall, it is proposed in the present document to make use of adjustable resistances within the driver signal generation unit 110. The adjustable resistance(s) may be used to control a degree of oscillations caused at the driven switch 104. In particular, the adjustable resistance may be adjusted to be sufficiently high, in order to maintain the amplitude of the oscillations at the driven switch 104 below a predetermined oscillation threshold. On the other hand, the adjustable resistance may be adjusted to be as low as possible, so as to reduce the overall power consumption of the driver circuit 160.

The adjustable resistance on the high side control path (comprising the high side gate control switch 113) and/or on the low side control path (comprising the low side gate control switch 112) may be adjusted by appropriately selecting the on-resistance $R_{on}$ of the gate control switches 112, 113 and/or by appropriately selecting the serial resistances 111, 114. The on-resistance $R_{on}$ of the low side and high side gate control switches 112, 113 may be adjusted e.g. by adjusting a gate voltage applied to the low side and high side gate control switches 112, 113 (being e.g. NMOS or PMOS transistors). Alternatively or in addition, the adjustable resistance may be adjusted by adjusting a number of auxiliary transistors, thereby increasing or decreasing the overall on-resistance $R_{on}$ of the transistors.

Figure 4:
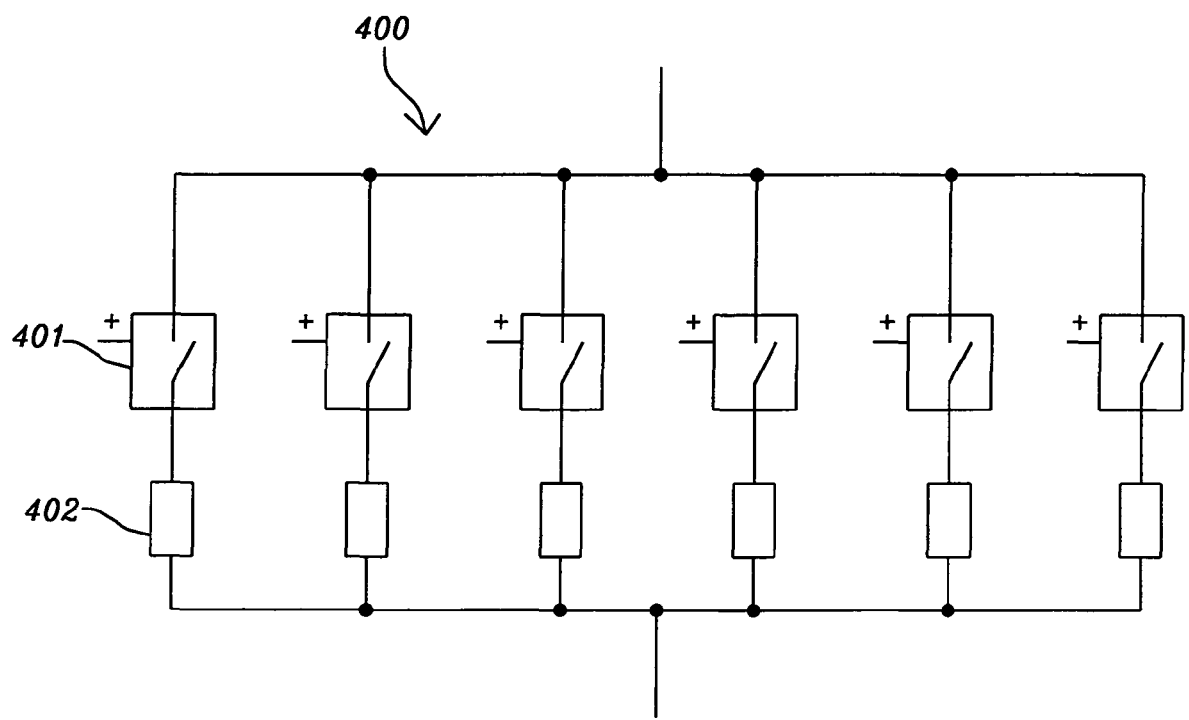
FIG. 4 shows an example adjustable resistance unit.

FIG. 4 illustrates an example adjustable resistance unit 400 which may be used within the driver circuit 160 to adjust the series resistance on the high side control path and/or the low side control path. In particular, the resistance unit 400 may be used to implement the adjustable serial resistances 111, 114. The resistance unit 400 comprises a plurality of auxiliary switches 401 which are arranged in parallel. Typically, the auxiliary switches 401 have an on-resistance $R_{on}$ which may be adjusted by adjusting a gate voltage applied to the auxiliary switches 401. Furthermore, the auxiliary switches 401 may be arranged in series with auxiliary resistors 402. By increasing/decreasing the number of parallel auxiliary switches 401 (and possible auxiliary resistors 402), the resistance of the resistance unit 400 (and consequently the resistance on the control path) can be decreased/increased.

As such, the use of an adjustable gate driver 160 for the external driven switch 104 is proposed. The adjustable gate driver 160 comprises an adjustable resistance on the control path. As has been outlined above, when driving the gate of the external driven switch 104 a ringing can accrue. This ringing is typically due to the parasitic inductors and capacitors in the source and the gate of the external driven switch 104. In order to reduce or stop the oscillation (i.e. the ringing), the use of a series resistor on the control path of the driver 160 towards the gate of the external driven switch 104 and/or an increase of the $R_{on}$ of the low side and high side gate control switches 112, 113) of the driver 160 is proposed.

Overall, this leads to an additional series resistor 111, 114 within the driver circuit 160, on the control path towards the gate of the external driven switch 104. The additional series resistor 111, 114 may be adjustable. In other words, the driver circuit 160 comprises an adjustable output resistance or impedance (also referred to as internal resistance or impedance) given by the overall resistance on the high side control path and/or the low side control path. Hence, the system comprising the external driven switch 104 and the driver circuit 160 may be tuned, in order to determine the lowest possible value of the additional series resistance 111, 114, thereby maintaining the degree of oscillations below a predetermined threshold, while keeping the power consumption of the driver circuit 160 at a minimum value. In other words, the output impedance of the driver circuit 160 may be tuned, in order to maintain the degree of oscillations below the predetermined threshold, while keeping the power consumption of the driver circuit 160 at a minimum value.

The tuning of the additional series resistor 111, 114 may start with an uncritical condition (i.e. a relatively high output impedance of the driver circuit 160). The relatively high resistance leads to a low cut-off frequency of the RC filter (comprising the gain-source capacitor of the driven switch 104), thereby strongly limiting high frequency components in the current provided by the driver circuit 160. The uncritical condition may be selected such that the oscillations at the external driven switch 104 are (almost) certainly below a predetermined degree of oscillations. The additional series resistor 111, 114 may be reduced until an oscillation starts. Once the oscillation has started, the additional series resistor 111, 114 may be reduced further until a predetermined degree of allowable oscillation (e.g. a pre-determined amplitude of oscillations) has been reached. The tuning of the additional series resistor 111, 114 may be repeated from time to time, in order to compensate for temperature drifts and/or in order to adapt the system 100, 160 to other supply voltages.

Figure 6:
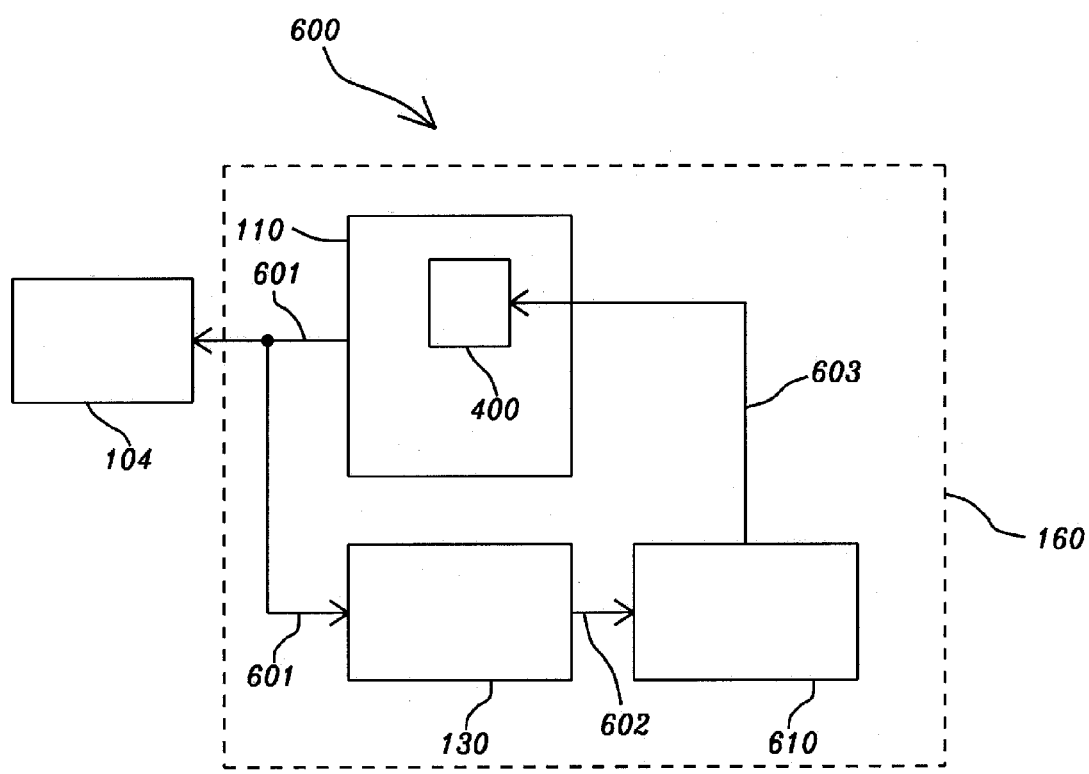
FIG. 6 shows an example resistance control unit.

The tuning of the overall resistance on the control path of the driver circuit 160 may be implemented in a resistance control unit (illustrated in FIG. 6). The resistance control unit is configured to adjust the overall resistance on the control path (e.g. using a resistance unit 400 as illustrated in FIG. 4) based on a measured or estimated degree of oscillations at the driven switch 104. The resistance control unit may determine a minimum overall resistance which maintains the degree of oscillations below a pre-determined level.

As outlined above, the degree of oscillations at the driven switch 104 may be measured directly at the driven switch 104 using e.g. a shunt resistor 106 for converting the source-drain current at the driven switch 104 into a voltage, and using a dedicated pin at the driver circuit 160 for capturing the voltage at the shunt resistor 106. This scheme for measuring the degree of oscillations is however disadvantageous, as it requires additional components, and an additional pin at the driver circuit 160. It is proposed in the present document to measure or estimate the degree of oscillations of the current at the driven switch 104 via the gate of the driven switch 104 (wherein the gate of the driven switch 104 is coupled to the driver circuit 160). In other words, it is proposed in the present document to estimate the degree of oscillations of the current at the driven switch 104 via a measurement of a degree of oscillations on the drive signal provided by the driver circuit 160. As a result, the need for an additional pin at the driver circuit 160 is removed.

The concept of estimating the degree of oscillations of the current at the driven switch 104 via a measurement of the degree of oscillations of the drive signal is based on an observation by the inventor that due to the relatively high resonant frequency of the parasitic LC circuit of the driven switch 104, the parasitic capacitors of the driven switch 104 act as a short circuit, thereby coupling oscillations on the current of the driven switch 104 to the drive signal. The degree of (coupled) oscillations of the drive signal may be significant, thereby endangering the components of the driver circuit 160. Hence, the present document is also directed at the protection of the components of the driver circuit 160.

In order to measure the degree of oscillations on the drive signal, the driver circuit 160 further comprises the oscillation detection unit 130. The oscillation detection unit 130 is used to detect the presence of oscillations at the external driven switch 104 directly from the driver circuit 160, without the need of an external resistor 106 at the switched-mode power supply 100 and an additional pin at the driver circuit 160.

The overall concept of the oscillation detection unit 130 may be described as follows: A gate capacitor is used for measuring oscillations on the drive signal (which correspond to oscillations at the source current of the external driven switch 104). The gate driver (i.e. the driver signal generation unit) may drive the gate of the external driven switch 104 with short pulses. In between the pulses, the gate floats. Due to the high frequency of the oscillations, the internal capacitor of the gate source (gate drain) makes the source transparent. By consequence, any voltage swing (or oscillation) from the source of the external driven switch 104 can be detected within the driver circuit 160.

The example oscillation detection unit 130 of FIG. 1 is implemented as a differential peak detector. The oscillation detection unit 130 may be decoupled from the driver signal generation unit 110 using a capacitor 120. The differential peak detector determines the difference between a negative peak voltage and a positive peak voltage at the gate of the external low side switch 104. For this purpose, the oscillation detection unit 130 comprises a first branch for determining a first peak voltage and a second branch for detecting a second peak voltage. The first branch comprises a first switch 131 (implemented as an NMOS transistor 131). Typically, the first switch 131 is on, thereby taking up the current provided by a first current source 132. The on-state of the first switch 131 can be ensured by pre-charging the capacitor 120 with a voltage which is greater or equal to the threshold voltage of the first switch 131. This can be achieved by an offset circuit comprising e.g. a level control switch 137 and a voltage source 138. The level control switch 137 may be switched on to pre-charge the capacitor 120, thereby generating a gate-source voltage at the first switch 131 which corresponds to the voltage provided by the voltage source 138 (if the external driven switch 104 is in the off-state). As such, it can be ensured that prior to generating a high drive signal; the first switch 131 is already in the on-state.

Upon receiving a high drive signal, the transient drive voltage is passed via the capacitor 120 to the gate of the first switch 131. The first switch 131 is already in the on-state (as a result of the offset circuit) and is operated in its linear region. This means that the variations of the gate voltage at the first switch 131 leads to a variation of the on-resistance of the first switch 131. In other words, any oscillations on the drive signal are directly converted into oscillations of the voltage drop at the first switch 131. The oscillating voltage drop at the first switch 131 may be smoothened using the first capacitor 133, thereby providing a peak voltage at the first port 139. The peak voltage at the first port 139 is typically proportional to the degree of oscillations on the drive signal.

The second branch comprises a second switch 136 (implemented as a PMOS transistor 136). The second branch works in a similar manner as the first branch. The offset circuit is used to place the second switch 136 in the linear region of the second switch 136 above its threshold voltage. Upon receipt of a high drive signal, oscillations on the drive signal translate into variations of the voltage drop at the second switch 136 (due to the current provided by the current source 134). The voltage drop may be smoothened using the capacitor 135. As a result a second peak voltage is generated at a second port 140, wherein the second peak voltage has an opposite polarization compared to the first peak voltage (if the second switch 136 is a PMOS transistor and the first switch 131 is an NMOS transistor or vice versa).

Hence, a degree of oscillation of the drive signal may be measured as the difference of the first and second peak voltages at the first and second ports 139, 140, respectively. The difference of the first and second peak voltages is typically proportional to the degree of oscillation.

Consequently, the oscillation detection unit 130 allows for the detection of oscillations of the gate voltage at the external driven switch 104 (i.e. oscillations of the driver signal) by determining a differential voltage at the first and second ports 139, 140. The differential voltage between the first and second ports 139, 140 is proportional to the amplitude of the oscillations. This means that a differential voltage which remains below a predetermined voltage threshold indicates that the amplitude of the oscillations is below a predetermined oscillation threshold. Hence, the differential voltage can be used to detect and to control the degree of oscillations. In particular, the differential voltage can be used as a feedback signal for the automatic tuning of the serial resistors 111, 114 within the resistance control unit.

In other words, the oscillation determination unit 130 comprises a source follower P Peak (i.e. the second switch 136) and a source follower N Peak (i.e. the first switch 131). The source followers are arranged to work as a differential fast peak detector or demodulator. An appropriate offset can be compensated using Auto Zero (AZ) techniques or an offset compensated reference. In FIG. 1, the offset is controlled using a reference voltage 138 with a level control switch 137, thereby ensuring that the first and second switches 131, 136 are operated in the linear region.

Figure 2:
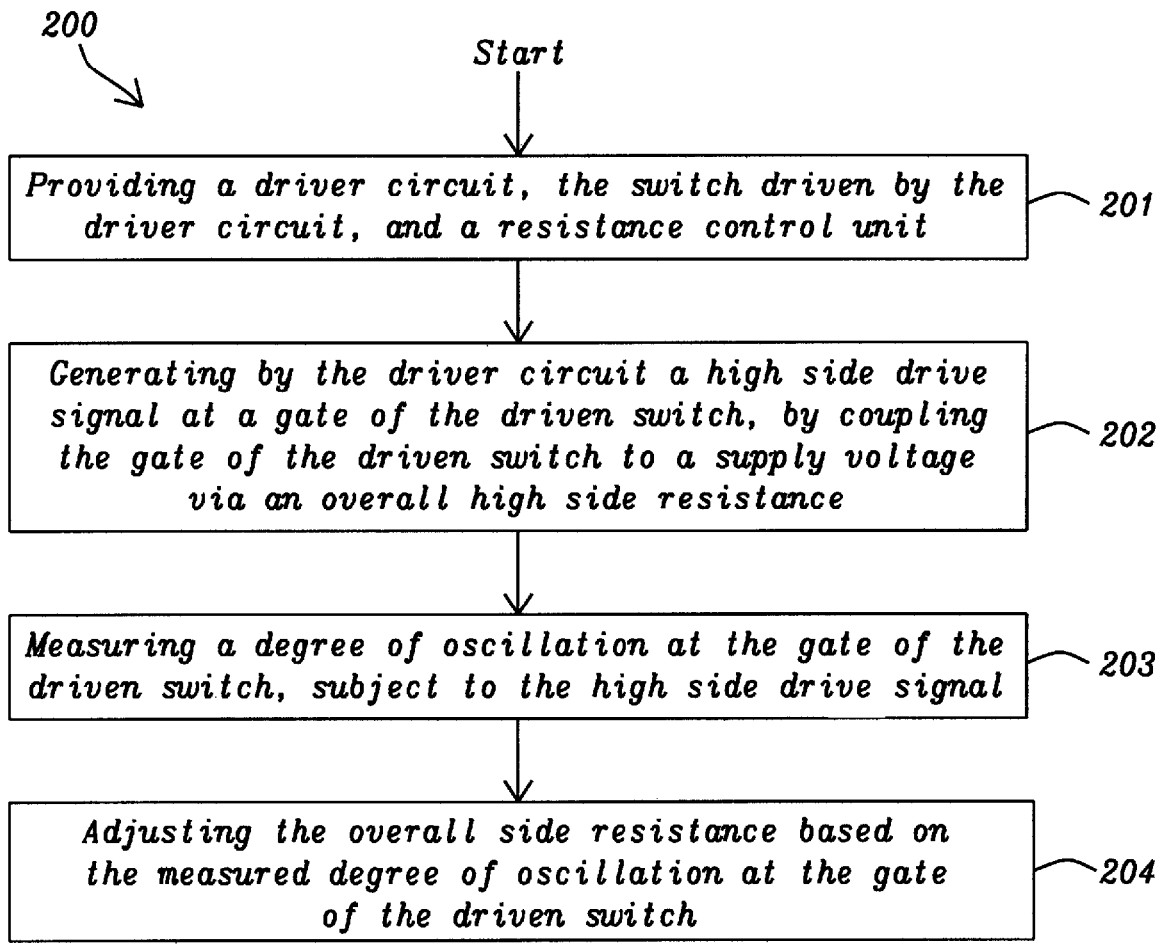
FIG. 2 illustrates an example method for maintaining the degree of oscillation of an (external) transistor below a pre-determined level.

FIG. 2 illustrates an example method 200 for maintaining the degree of oscillations of the drain source current through an external driven switch 104 below a pre-determined threshold. The method 200 is explained with regards to the high side control switch 113 and the high side resistance 114; however, the method 200 is also applicable in an analogous manner for the low side control switch 112 and the low side resistance 111. The method 200 comprises the step of providing a driver circuit, the switch driven by the driver circuit, and a resistance control unit (step 201), followed by the step of generating a high drive signal (e.g. a pulsed high drive signal) for triggering the (external) driven switch 104 to switch from an off-state to an on-state (step 202). The method 200 proceeds in measuring (step 203) a degree of oscillation of the drive signal (e.g. subsequent to the end of the pulsed high drive signal). The measuring of the degree of oscillation may be performed as outlined in the present document. Subsequently, the high side resistance 114 is adjusted (step 204), based on the measured degree of oscillation. In particular, the high side resistance 114 is adjusted, in order to maintain the degree of oscillation below a pre-determined level, while at the same time minimizing the overall high side resistance, thereby minimizing the losses incurred by the driver circuit 160.

Figure 3A:
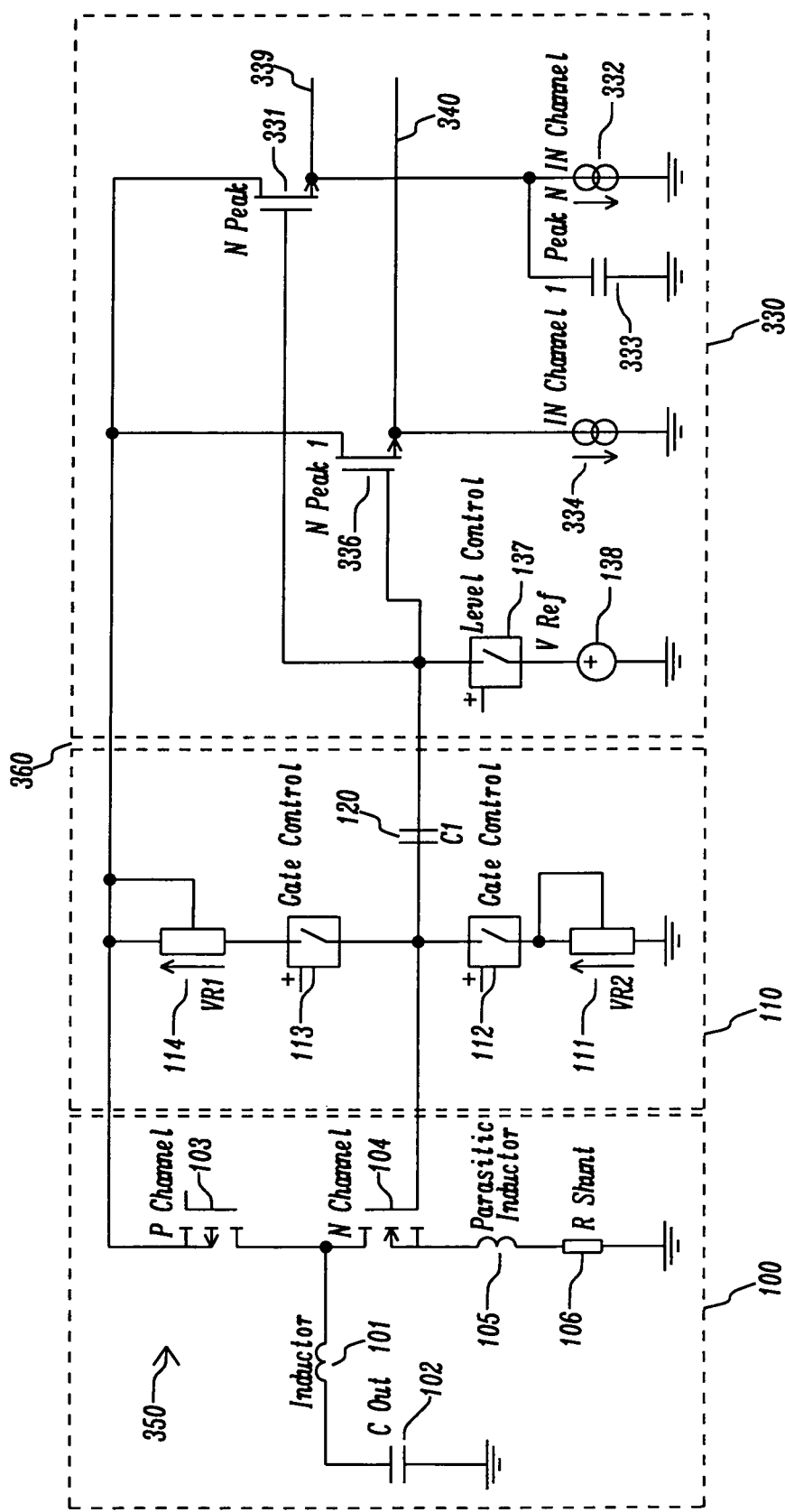
FIG. 3a illustrates a circuit diagram of another example driver circuit for an external transistor.

FIG. 3a illustrates a circuit diagram 350 of a further driver circuit 360 comprising an alternative implementation of an oscillation detection unit 330. The oscillation detection unit 330 comprises the first peak detection path of FIG. 1 for detecting a first peak voltage from the drive signal. The first peak detection path comprises a first switch 331, a first capacitor 333 and a first current source 332. The first peak detection path provides a first peak voltage at the first port 339. Furthermore, the oscillation detection unit 330 comprises a second path. The second path comprises a second switch 336 and a current source 334, and is configured to provide an oscillating voltage at a second port 340. As such, the oscillation detection unit 330 comprises only a single peak detection path. The presence of oscillations and the degree of oscillations may be determined based on the difference of the peak voltage and the oscillating voltage. In other words, the oscillation detection unit 330 comprises a source follower 331 having a capacitor 333 such that the source follower 331 is acting as a filter.

Figure 3B:
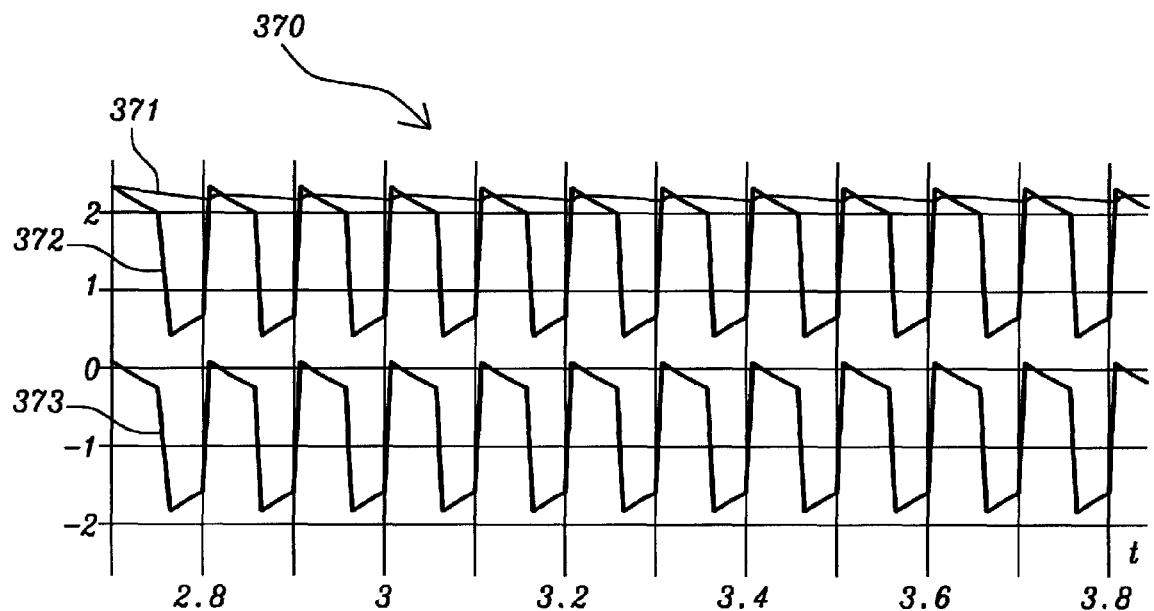
FIGS. 3b and 3c show example voltages at the output of the oscillation determination unit.
Figure 3C:
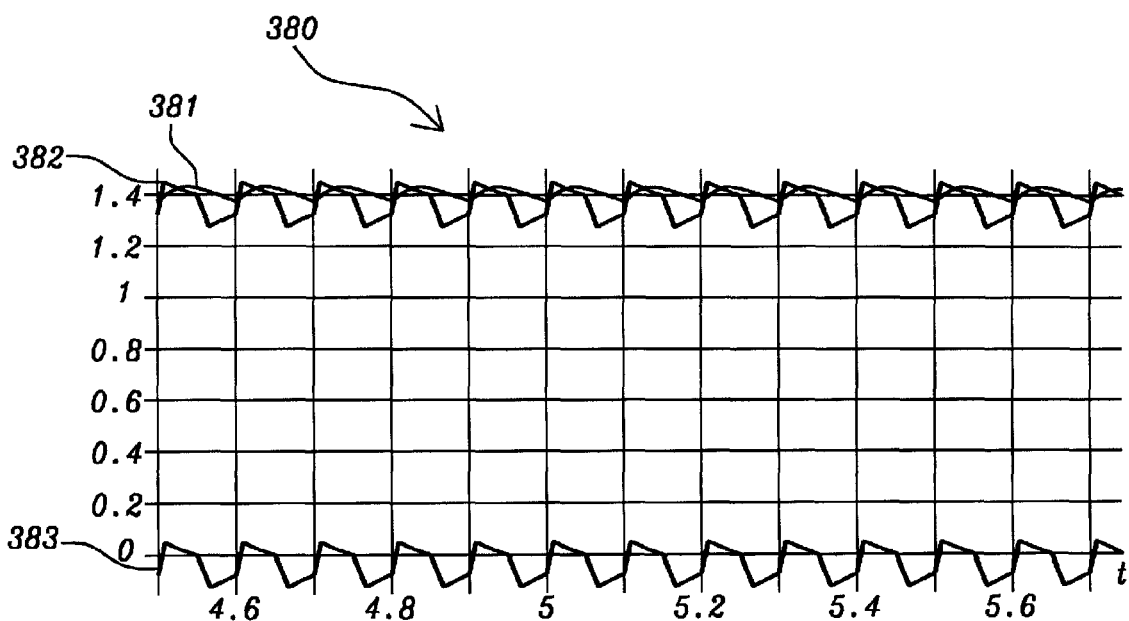

The generation of the oscillating voltage at the second port 340 and the peak voltage at the first port 339 can be illustrated based on the measurement results of FIGS. 3b and 3c. FIG. 3b shows a voltage/time diagram 370 for an example drive signal oscillating with an amplitude of 2V. Due to the linear operation of the second switch 336, the oscillation of the drive signal is directly translated into an oscillating voltage drop at the second switch 336, and by consequence an oscillating voltage 372 at the second port 340. As a result of a filter function of the capacitor 333, the oscillations are filtered, thereby providing the peak voltage 371 at the first port 339. Furthermore, FIG. 3b illustrates the difference 373 between the peak voltage 371 and the oscillating voltage 372. FIG. 3c illustrates a similar voltage/time diagram 380 for an example drive signal oscillating with an amplitude of 200 mV. FIG. 3c shows the oscillating voltage 382, the peak voltage 381 and the difference 383 between the peak voltage 381 and the oscillating voltage 382.

Figure 5:
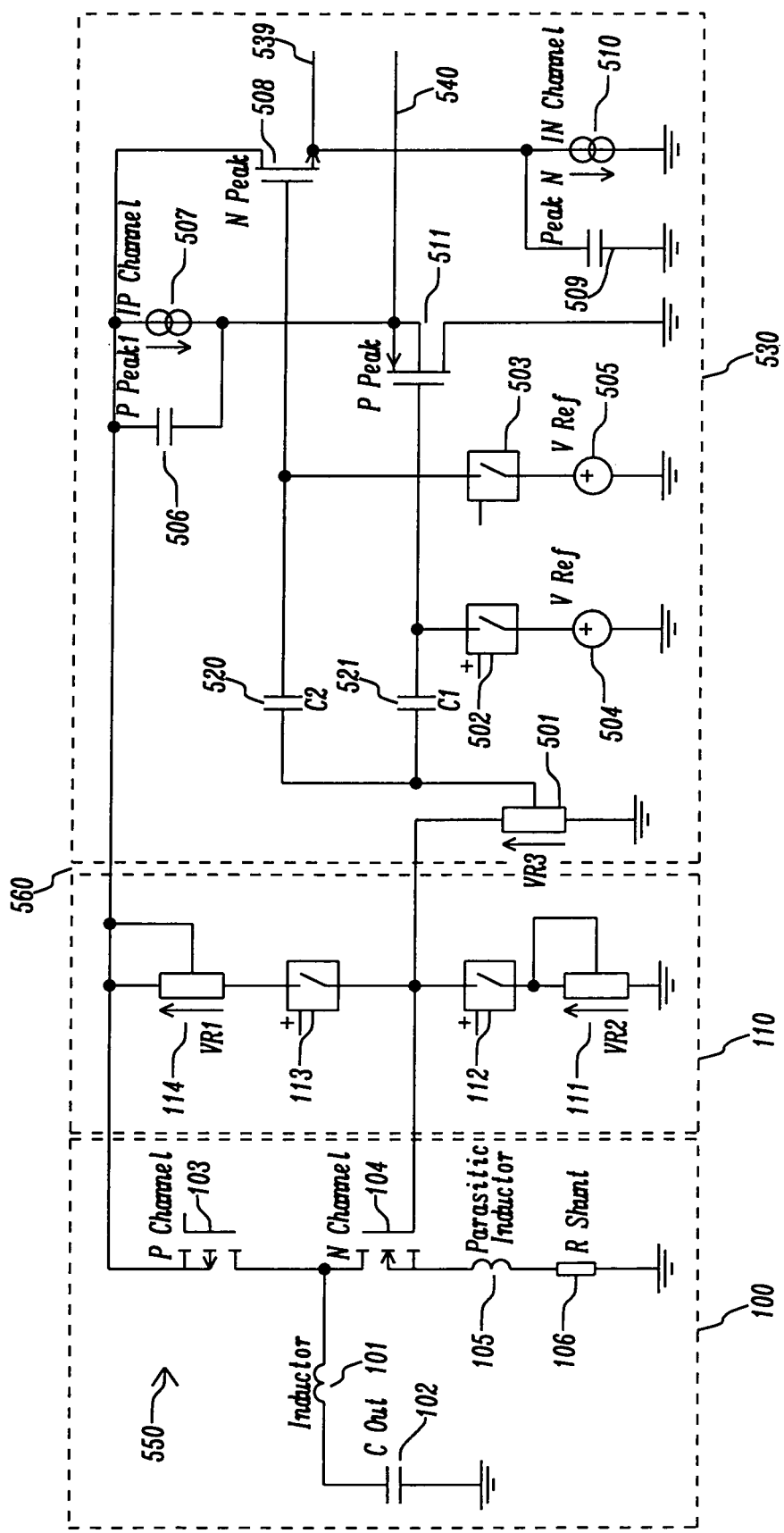
FIG. 5 illustrates another circuit diagram of an example driver circuit for an external transistor.

FIG. 5 shows a circuit diagram 550 of a buck converter 110 and an example driver circuit 560 comprising another example oscillation detection unit 530. In a similar manner to the oscillation detection unit 130 of FIG. 1, the oscillation detection unit 530 comprises a first peak detection path comprising first switch 508 (e.g. an NMOS transistor), first current source 510, first capacitor 509, providing a first peak voltage at the first port 539. Furthermore, the oscillation detection unit 530 comprises a second peak detection path (second switch 511 (e.g. a PMOS transistor), second current source 507, second capacitor 506) providing a second peak voltage at the second port 540. In contrast to the circuit diagram 150 of FIG. 1, the oscillation detection unit 530 comprises two offset circuits, one for each peak detection path. The first offset circuit (level control switch 503, reference voltage 505) may be used to pre-charge the capacitor 520 prior to the generation of a high drive signal by the driver signal generation unit 110, thereby ensuring that the first switch 508 is in the on-state (and operated in the linear region). The second offset circuit (level control switch 502, reference voltage 504) may be used to pre-charge the capacitor 521 prior to the generation of a high drive signal by the driver signal generation unit 110, thereby ensuring that the second switch 511 is in the on-state (and operated in the linear region).

Furthermore, the oscillation detection unit 530 comprises a voltage limitation unit 501 which may be used to reduce the voltage at the first and second switches 508, 511, in order to ensure that the first and second switches 508, 511 are operated in the linear region. VR3 signifies the voltage drop along voltage limitation unit 501. The voltage limitation unit 501 may be implemented as a voltage divider, thereby passing only a fraction of the drive signal to the oscillation detection unit 530.

FIG. 6 shows a block diagram 600 of an example driver circuit 160 comprising a resistance control unit 610. The driver circuit 160 comprises a drive signal generation unit 110 with an adjustable resistance unit 400. The adjustable resistance unit 400 may e.g. be placed in the high side control path and/or the low side control path of the drive signal generation unit 110. The drive signal generation unit 110 generates a drive signal 601 using the settings of the resistance unit 400 (i.e. using a particular output impedance of the driver circuit 160 which depends on the resistance value set by the resistance unit 400). The drive signal 601 is sensed by the oscillation determination unit 130 which is configured to determine a degree of oscillation 602 of the drive signal 601. The degree of oscillation 602 may be provided, e.g. as a voltage signal, to the resistance control unit 610. The resistance control unit 610 is configured to determine updated settings 603 of the resistance unit 400 based on the degree of oscillation 602. In particular, the resistance control unit 610 may be configured to minimize the output resistance of the driver circuit 160 as much as possible, while at the same time maintaining the degree of oscillation 602 at or below a pre-determined threshold. The resistance control unit 610 may be configured to generate updated settings 603 of the resistance unit 400 at the switching rate of the external driven switch 104 (i.e. at the commutation cycle rate). Alternatively or in addition, the resistance control unit 610 may be configured to generate updated settings 603 of the resistance unit 400 upon request.

In the present document, a driver circuit 160 for driving an external driven switch 104 has been described. The driver circuit 160 is configured to drive the external driven switch 104 such that ringing at the external driven switch 104 can be avoided, while at the same time minimizing power dissipation at the driver circuit 160. The described driver circuit 160 makes use of adjustable series resistors on the gate control paths, wherein the series resistors may be adjusted based on a degree of oscillations sensed on the driver signal.

It should be noted that the description and drawings merely illustrate the principles of the proposed methods and systems. Those skilled in the art will be able to implement various arrangements that, although not explicitly described or shown herein, embody the principles of the disclosure and are included within its spirit and scope. Furthermore, all examples and embodiment outlined in the present document are principally intended expressly to be only for explanatory purposes to help the reader in understanding the principles of the proposed methods and systems. Furthermore, all statements herein providing principles, aspects, and embodiments of the disclosure, as well as specific examples thereof, are intended to encompass equivalents thereof.

The invention claimed is:

1. A driver circuit configured to generate a drive signal for switching a driven switch between an off-state and an on-state, the driver circuit comprising:
   a. a drive signal generation unit configured to generate a portion of the drive signal which triggers the driven switch to switch to the on-state; wherein an output resistance of the driver circuit is adjustable;
   b. an oscillation detection unit configured to detect a degree of oscillation on the drive signal; and
   c. a resistance control unit configured to adjust the output resistance of the driver circuit based on the degree of oscillation on the drive signal; wherein the resistance control unit is configured to increase the output resistance of the driver circuit to lower the degree of oscillation, if the degree of oscillation is above a pre-determined threshold; and decrease the output resistance of the driver circuit, if the degree of oscillation is below the pre-determined threshold.

2. The driver circuit of claim 1, wherein the drive signal generation unit comprises:
   a. a high side gate control switch configured to couple a gate of the driven switch to a supply voltage via an overall high side resistance, thereby generating the portion of the drive signal which triggers the driven switch to switch to the on-state; wherein the overall high side resistance is adjustable; and wherein the output resistance of the driver circuit corresponds to the overall high side resistance, when the high side gate control switch couples the gate of the driven switch to the supply voltage.

3. The driver circuit of claim 1, wherein the drive signal generation unit comprises:
   a. a low side gate control switch configured to couple a gate of the driven switch to ground via an overall low side resistance, thereby generating another portion of the drive signal which triggers the driven switch to switch to the off-state; wherein the overall low side resistance is adjustable; and wherein the output resistance of the driver circuit corresponds to the overall low side resistance, when the low side gate control switch couples the gate of the driven switch to ground.

4. The driver circuit of claim 2, wherein the overall high side resistance comprises any one or more of:
   a. an on-resistance of the high side gate control switch; wherein the on-resistance of the high side gate control switch is adjustable via a gate voltage applied to the high side gate control switch;
   b. an adjustable resistance unit in series with the high side gate control switch; wherein the adjustable resistance unit comprises one or more parallel auxiliary switches; and
   c. a serial resistance in series with the high side gate control switch.

5. The driver circuit of claim 2, wherein:
   a. the high side gate control switch is operated in a pulsed mode by coupling the gate of the driven switch to the supply voltage for a pre-determined time interval; and
   b. the pre-determined time interval is shorter than a duration of the on-state of the driven switch.

6. The driver circuit of claim 1, wherein the oscillation detection unit comprises a first oscillation detection path, and wherein the first oscillation detection path comprises:
   a. a current source;
   b. a first switch, configured to conduct current provided by the current source; wherein the first switch has an adjustable on-resistance; and
   c. a first output port between the current source and the first switch; wherein a first output voltage is provided at the first output port; and wherein the first output voltage is indicative of the degree of oscillation on the drive signal.

7. The driver circuit of claim 6, wherein said first switch is coupled to the drive signal, such that oscillations on the drive signal result in corresponding oscillations of the on-resistance of the first switch, and in corresponding oscillations of a voltage drop at the first switch.

8. The driver circuit of claims 6, wherein the first oscillation detection path further comprises
   a. a capacitor arranged in parallel to the current source and configured to low-pass filter oscillations of a voltage drop at the first switch.

9. The driver circuit of claim 6, wherein the first oscillation detection path further comprises
   a. an offset unit configured to switch the first switch to the on-state prior to the generation of the portion of the drive signal which triggers the driven switch to switch to the on-state.

10. The driver circuit of claim 6, wherein the oscillation detection unit further comprises:
   a. a second oscillation detection path configured to provide a second output voltage based on the drive signal; wherein the second output voltage is indicative of the degree of oscillation on the drive signal; wherein the second output voltage has a polarity opposite to the first output voltage.

11. The driver circuit of claim 1, wherein the driver circuit is implemented on an integrated circuit separate from the driven switch.

12. A method for maintaining a degree of oscillation of a drain source current of a driven switch below a pre-determined threshold, when switching the driven switch between an off-state and an on-state, the method comprising:
   a. providing a driver circuit, the driven switch which is driven by the driver circuit, and a resistance control unit;
   b. generating by the driver circuit a portion of a drive signal at a gate of the driven switch, which triggers the driven switch to switch to the on-state, by coupling the gate of the driven switch to a supply voltage via an overall high side resistance;
   c. measuring the degree of oscillation at the gate of the driven switch, subject to the portion of the drive signal which triggers the driven switch to switch to the on-state; and
   d. adjusting the overall high side resistance based on the measured degree of oscillation at the gate of the driven switch; wherein adjusting the overall high side resistance comprises:
      increasing the overall high side resistance to lower the degree of oscillation if the degree of oscillation is above a pre-determined threshold; and
      decreasing the overall high-side resistance of the driver circuit if the degree of oscillation is below the pre-determined threshold.

13. The method of claim 12, wherein:
   a. the drive signal is a pulsed drive signal having a pre-determined pulse duration; and
   b. the degree of oscillation at the gate of the driven switch is measured subsequent to the pre-determined pulse duration.

14. The method of claim 13, wherein the portion of the pulsed drive signal, which triggers the driven switch to switch to the on-state, is generated by coupling the gate of the driven switch to the supply voltage for the pre-determined pulse duration, wherein the pre-determined pulse duration is shorter than the duration of the on-state of the driven switch and wherein subsequent to the pulsed drive signal, the gate of the driven switch floats.

15. The method of claim 13, wherein another portion of the pulsed drive signal, which triggers the driven switch to switch to the off-state, is generated by coupling the gate of the driven switch to ground for the pre-determined time interval, wherein the pre-determined time interval is shorter than the duration of the off-state of the driven switch and wherein subsequent to the pulsed drive signal, the gate of the driven switch floats.

16. The method of claim 12, wherein the driver circuit comprises an oscillation detection unit configured to detect the degree of oscillation of the drive signal.

17. The method of claim 16, wherein a first output voltage based on the drive signal is provided by a first oscillation detection path, wherein the first output voltage is indicative of the degree of oscillation on the drive signal.

18. The method of claim 17, wherein a second output voltage based on the drive signal is provided by a second oscillation detection path, wherein the second output voltage is indicative of the degree of oscillation on the drive signal, wherein the second output voltage has a polarity opposite to the first output voltage.

19. The method of claim 12, wherein the gate of the driven switch is coupled to the supply voltage via the overall high side resistance by a high side gate control switch, thereby generating the portion of the drive signal which triggers the driven switch to switch to the on-state, wherein when generating the side portion of the drive signal which triggers the driven switch to switch to the on-state, an output resistance of the driver circuit corresponds to the overall high side resistance.

20. The method of claim 12, wherein the gate of the driven switch is coupled to ground via an overall low side resistance by a low side gate control switch, thereby generating another portion of the drive signal which triggers the driven switch to switch to the off-state, wherein when generating the other portion of the drive signal which triggers the driven switch to switch to the off-state, an output resistance of the driver circuit corresponds to the overall low side resistance.

* * * * *